United States Patent [19]

Chao

[11] Patent Number: 5,498,440
[45] Date of Patent: Mar. 12, 1996

[54] ADHESION OF ELECTROLESS COATING TO RESINOUS ARTICLES

[75] Inventor: Herbert S. Chao, Schenectady, N.Y.

[73] Assignee: General Electric Company, Schenectady, N.Y.

[21] Appl. No.: 822,771

[22] Filed: Jan. 21, 1992

[51] Int. Cl.⁶ ........................................ B05D 3/04
[52] U.S. Cl. .................. 427/304; 427/305; 427/306; 427/437; 427/443.1
[58] Field of Search ............................. 427/304, 305, 427/306, 437, 443.1

[56] References Cited

U.S. PATENT DOCUMENTS

| 4,217,438 | 8/1980 | Brunelle | 528/202 |
|---|---|---|---|
| 4,272,584 | 6/1981 | Goldberg | 427/306 |
| 4,335,164 | 6/1982 | Dillard | 427/306 |
| 4,940,608 | 7/1990 | Kawagishi | 427/306 |
| 4,959,121 | 9/1990 | Dumas et al. | 156/668 |
| 4,999,251 | 3/1991 | Foust et al. | 428/458 |
| 5,132,191 | 7/1992 | Zarnoch | 428/626 |

FOREIGN PATENT DOCUMENTS

| 230985 | 11/1985 | Japan | C23C 18/29 |
|---|---|---|---|

OTHER PUBLICATIONS

"ABS Joins Plastics That Can Be Plated" C & EN Mar. 25, 1968 pp. 48–49.
English Translation of Japanese Patent 60-230985.

*Primary Examiner*—Benjamin Utech
*Attorney, Agent, or Firm*—William H. Pittman

[57] ABSTRACT

The adhesion of metal coatings deposited by electroless deposition on polycarbonate-addition polymer substrates, especially polycarbonate-ABS substrates, is improved by first contacting the substrate with an alkali metal hydroxide solution followed by concentrated nitric acid.

14 Claims, No Drawings

ADHESION OF ELECTROLESS COATING TO RESINOUS ARTICLES

This invention relates to the metallization of plastic surfaces, and more particularly to a metallization method useful with thermoplastic resin blends comprising principally polycarbonate.

Metallized plastics have become of interest in recent years as a replacement for metal in such articles as enclosures for electrical appliances, microwave ovens, business machines and the like. When fabricated of plastics alone, such enclosures are inadequate to shield internal parts from external radiation sources such as electromagnetic interference, particularly radio frequency interference, and static electricity, and also to prevent escape of internally generated radiation. Such sources of interference can be blocked out by providing a metal coating on the surface of the plastic substrate, typically by electroless or electrolytic deposition. Metallization is also desirable for the formation of printed circuit boards, whereupon the entire surface or a portion thereof is metallized and is then masked and etched in areas where metal traces are not desired.

One of the most serious problems which arise in the metallization of plastics is the lack of adhesion of the metal layer to the substrate. Adhesion is generally measured as "peel strength", which is the force required to peel an adherent metal layer from a substrate under controlled conditions.

Various methods for improving adhesion of metal layers to the surfaces of thermoplastic substrates are known. For example, methods applicable to polyimides in general and polyetherimides in particular are disclosed in U.S. Pat. Nos. 4,959,121 and 4,999,251. Copending, commonly owned application Ser. No. 07/603,648, U.S. Pat. No. 5,132,191, describes a method applicable to the surfaces of aromatic polymers and particularly polycarbonates, comprising nitration of the polymeric surface with a strong nitrating agent such as a mixture of concentrated nitric and sulfuric acids, followed by ammonolytic cleavage of the nitrated polymer molecules.

Among the thermoplastic materials now in use in the foregoing applications are blends of aromatic polycarbonates and various addition polymers, including addition polymers comprising structural groups derived from olefinic nitriles such as acrylonitrile and dienes such as butadiene. A particularly useful class of addition polymers for use in such blends consists of copolymers of acrylonitrile, butadiene and styrene, sometimes identified hereinafter as "ABS resins". They may be prepared by various methods, including the grafting of styrene and acrylonitrile units on a previously prepared polybutadiene latex.

The method for improving adhesion of metal coatings to the surfaces of polycarbonate substrates by nitration and ammonolytic cleavage, described in the aforementioned copending application, is not satisfactory for employment with polymer blends of this type. It causes serious blistering of the metal layer when the metallized substrate is contacted with a metal plating solution.

Another method which has been employed with such blends is solvent swelling, typically with a glycol or ether thereof, followed by etching with chromic acid. It creates a very rough surface which is subject to cracking, resulting in decreased impact strength. Moreover, chromic acid has adverse effects on the environment after disposal.

The present invention provides a somewhat milder method for improving adhesion of metal coatings to polycarbonate-ABS resin substrates and the like than the aforementioned chromic acid and nitration-ammonolysis methods. Said method is relatively simple and may be easily incorporated in electroless and electrolytic deposition operations. The metal coatings deposited by said method retain their high adhesion even under prolonged high humidity conditions.

In one of its aspects, the invention is a method for depositing an adherent metal layer on the surface of a resinous substrate comprising a major proportion of aromatic polycarbonate and a minor proportion of at least one addition copolymer comprising structural groups derived from an olefinic nitrile and a conjugated diene, said method comprising the steps of:

contacting at least a portion of said surface with an aqueous alkali metal hydroxide solution having an alkali metal hydroxide concentration of at least about 30% by weight, contacting said surface with concentrated nitric acid alone, and depositing an electroless metal layer on said surface.

The aromatic polycarbonates employed in the blends to which the method of this invention is applicable generally comprise structural units of the formula

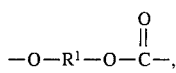

wherein each $R^1$ independently is a divalent aromatic organic radical. The $R^1$ values may be different but are usually the same. Suitable $R^1$ values include m-phenylene, p-phenylene, 4,4'-biphenylene, 2,2-bis(4-phenylene)propane and similar radicals such as those which correspond to the aromatic dihydroxy compounds disclosed by name or formula (generic or specific) in U.S. Pat. No. 4,217,438, the disclosure of which is incorporated by reference herein. Also included are radicals containing non-hydrocarbon moieties. These may be substituents such as chloro, nitro, alkoxy and the like, and also linking radicals such as thio, sulfoxy, sulfone, ester, amide, ether and carbonyl. Most often, however, all $R^1$ radicals are hydrocarbon radicals.

The $R^1$ radicals preferably have the formula $$(II) \quad -A^1-Y-A^2-,$$

wherein each of $A^1$ and $A^2$ is a monocyclic divalent aromatic radical and Y is a bridging radical in which one or two atoms separate $A^1$ from $A^2$. The free valence bonds in formula II are usually in the meta or para positions of $A^1$ and $A^2$ in relation to Y.

In formula II, the $A^1$ and $A^2$ values may be unsubstituted phenylene or substituted derivatives thereof, illustrative substituents (one or more) being alkyl, alkenyl, halo (especially chloro and/or bromo), nitro, alkoxy and the like. Unsubstituted phenylene radicals are preferred. Both $A^1$ and $A^2$ are preferably p-phenylene, although both may be o- or m-phenylene or one o- or m-phenylene phenylene and the other p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, 2-[2.2.1]-bicycloheptylmethylene, ethylene, isopropylidene, neopentylidene, cyclohexylidene, cyclopentadecylidene, cyclododecylidene or adamantylidene, especially a gem-alkylene (alkylidene) radical. Also included, however, are unsaturated radicals and radicals which contain atoms other than carbon and hydrogen; for example, 2,2-dichloroethylidene, carbonyl, phthalidylidene, oxy, thio, sulfoxy and sulfone. For reasons of availability and particular suitability for the purposes of this invention, the preferred radical of formula II is the 2,2-bis(4- phenylene)propane radical, which is derived from bisphenol A and in which Y is isopropylidene and $A^1$ and $A^2$ are each p-phenylene.

Another essential constituent of the plastic substrates treated according to the present invention is an addition polymer comprising structural units derived from an olefinic nitrile and a conjugated diene. Typical olefinic nitriles are acrylonitrile and methacrylonitrile, the former generally being preferred because of its availability and particular suitability. Suitable dienes include butadiene, isoprene, chloroprene and 1,3-hexadiene, with butadiene being preferred.

The addition copolymer usually also contains structural units derived from an alkenylaromatic compound such as styrene, α-methylstyrene or 4-methylstyrene. Styrene is generally preferred. For the sake of brevity, frequent reference hereinafter will be made to acrylonitrile, styrene and butadiene as the monomers employed. However, it should be understood that other monomers within each genus defined hereinabove may be substituted therefor when appropriate.

Thus, the suitable addition polymers include the ABS resins, which are generally preferred in the present invention. As previously mentioned, the preferred ABS resins are those prepared by the grafting of styrene and acrylonitrile on a previously formed polybutadiene latex. A possible intermediate in such a method of preparation is a styrene-acrylonitrile copolymer, sometimes hereinafter designated "SAN copolymer". It is also within the scope of the invention, however, to employ as the ABS resin a blend of an SAN copolymer with a previously formed ABS polymer with a relatively high proportion of butadiene units, typically about 40–75% and preferably at least about 50% by weight hereinafter designated "high rubber graft". In any event, the proportions of combined styrene and acrylonitrile in the ABS resin are most often about 60–90% and preferably about 70–80%.

Proportions of acrylonitrile and styrene taken individually are subject to wide variation, depending on the properties desired in the resinous article. Most often, the styrene comprises about 60–90% by weight of the mixture of the two monomers. Unless special conditions are employed, a styrene-acrylonitrile copolymer generally comprises about 75% styrene and about 25% acrylonitrile structural units irrespective of the monomer proportions in the copolymerization mixture, and those are therefore the proportions most often employed.

Polycarbonate comprises a major proportion of the polycarbonate-ABS blend, usually about 65–95% by weight and most often about 70–90% thereof. Under these conditions, the polycarbonate is usually the continuous phase in the resin blend with the ABS resin being dispersed therein. No copolymerization between the polycarbonate and the ABS resin is usually observed, but copolymerization is not precluded for the purposes of the invention.

The resinous substrate may contain other materials in addition to the above-described resins. These include flame retardants, initiators, inhibitors, stabilizers, plasticizers, pigments, antistatic agents, impact modifiers, fillers and mold release agents.

Prior to the method of this invention, it is frequently preferred to clean the surface of the substrate with a conventional detergent or degreasing agent. Typical degreasing agents are halohydrocarbons, especially chlorofluorohydrocarbons such as 1,1,2-trichlorotrifluoroethane.

The first step of the method of the invention involves contact between the substrate and an aqueous alkali metal hydroxide solution such as sodium hydroxide or potassium hydroxide, having an alkali metal hydroxide concentration of at least about 30% and preferably about 40–50% by weight. Contact is typically for a period from about 15 seconds to about 2 minutes. Typical contact temperatures are in the range of about 30°–90° C., especially about 70°–80° C. Following this treatment, the substrate is usually rinsed with water and dried to avoid neutralization and/or dilution of the concentrated nitric acid employed in the next step.

The nitric acid employed in the next step most often has a concentration from about 35% to about 70–71% by weight. Said step employs nitric acid alone; that is, it is not used in admixture with other acids such as sulfuric acid or other active reagents. The time of contact of the substrate with the nitric acid is typically from about 30 seconds to about 10 minutes and depends to some extent on the concentration of nitric acid employed, with necessary contact time being inversely related to concentration; those skilled in the art will readily be able by simple experimentation to determine the optimum time. The contact temperature is ordinarily in the range of about 10°–50° C. A second water rinse is normally employed following the nitric acid treatment.

The chemical effect of the alkali-nitric acid treatment employed according to this invention is not known with certainty. It is believed that one effect is nitration of the surface, possibly including the nitrile groups in the addition polymer and any phenolic hydroxy groups in the polycarbonate.

Finally, the substrate is subjected to electroless metal deposition, typically by conventional methods involving art-recognized, commercially available reagents. Such methods generally begin with a pretreatment to aid in the absorption of electroless deposition catalyst, typically with a reagent such as Shipley 1175A which is an alkaline solution containing organic compounds. This may be followed by surface activation employing, for example, Shipley Cataprep® 404 containing sodium bisulfate and various surfactants; and then by treatment with an acidic palladium-containing solution as catalyst, illustrated by Shipley Cataposit® 44 which comprises tin and palladium compounds, the palladium being the principal catalytic species.

After a water rinse, the substrate may be immersed in a solution of Shipley Cuposit® Accelerator 19, a fluoboric acid-containing formulation used to remove tin, or an equivalent thereof. It may then be further rinsed with water and treated with one or more electroless plating solutions.

Electroless plating baths are well known in the art and are generally described, for example, in Kirk-Othmer, Encyclopedia of Chemical Technology, Third Edition, Volume 8, the contents of which are incorporated herein by reference. The selection of a particular electroless plating bath or process is not critical to the invention. The contents of the bath and the plating parameters such as temperature, pH and immersion time will of course depend on the metal to be deposited, as well as on the precise nature of the resinous substrate.

Suitable plating baths include Shipley Cuposit® 250 and 251 and Enthone 406 and 426, the former being electroless copper and the latter electroless nickel plating solutions. When nickel is the first metal deposited, it is often found that optimum adhesion to the substrate is provided when the nickel layer is at least about 1.5 microns thick.

The substrate may be further treated with metal after the initial electroless plating operation. Such further treatment may be by electroless or electrolytic deposition of various metals, the details of which are likewise known to those skilled in the art.

Resinous substrates subjected to treatment by the above-described method are another aspect of the invention. They have substantially improved adhesion of the metal to the resin surface, in comparison with untreated substrates. This is shown by the results of a cross-hatch tape test adapted from ASTM procedure D3359. In the adaptation, a tool is used to score the metal surface with a series of perpendicular lines to form a grid. A piece of pressure-sensitive tape ("Permacel 310" of 3M Co.) is adhered to the metal surface over the grid and is sharply removed by pulling at approximately 90°. The grid area is then visually inspected for removal of the metal layer and evaluated on a scale of 0–5, with 5 designating essentially no metal removed and 0 designating a large amount of metal removed.

The invention is illustrated by the following examples. All percentages are by weight unless otherwise indicated.

EXAMPLE 1

A test substrate 2.5×15.2×0.3 cm. in size was molded from a polymer blend consisting of 88.4% bisphenol A polycarbonate having a weight average molecular weight (as determined by gel permeation chromatography) of 24,000, 5.5% SAN copolymer, 6.1% high rubber graft and various conventional additives including 8.9%, based on total resin content, of tetraphenyl resorcinol diphosphate as a flame retardant, said blend containing 8.6% total SAN copolymer and 3.0% butadiene units. The test strip was degreased by immersion for 2 minutes in 1,1,2-trichlorotrifluoroethane which was removed by evaporation, and was then immersed for 2 minutes at 75° C. in a 45% (by weight) aqueous potassium hydroxide solution. It was rinsed with water by immersion for 2 minutes, blow-dried and immersed for about 2 minutes at room temperature in concentrated nitric acid.

The test strip was then coated with an electroless copper-nickel coating by the following scheme of operations:
Water rinse - 5 minutes;
Shipley Cleaner-Conditioner 1175A- 5 minutes, 75° C.;
Water rinse - 2 minutes;
Shipley Cataprep 404 - 1 minute;
Shipley Cataposit 44- 3 minutes, 44° C.;
Water rinse - 2 minutes;
Shipley Accelerator 19 - 3 minutes;
Water rinse - 2 minutes;
Enthone 426 electroless nickel plating solution - 18 minutes, 55° C., pH 6.2.

After application of the electroless nickel layer, the sample passed the cross-hatch tape test with a rating of 5.

Treatment was continued with contact for 20 minutes with Shipley 251 electroless copper plating solution at 48° C. The cross-hatch tape test also gave a rating of 5 after this operation.

Treatment was continued as follows:
10% aqueous sulfuric acid - 1 minute;
Water rinse - 2 minutes;
Aqueous PdCl$_2$-HCl (0.1 by weight/1.0% by volume) solution - 1 minute;
Water rinse - 2 minutes;
Enthone 426 electroless nickel plating solution - 10 minutes, 55° C., pH 6.2.

After completion of treatment, the strip again passed the cross-hatch tape test with a rating of 5. Its surface resistivity was 0.054 ohm/square.

The strip was maintained at 100% humidity and 65° C. for 4 days. After that time, it passed the cross-hatch tape test with a rating of 4 and its surface resistivity was 0.051 ohm/square.

EXAMPLE 2

A test substrate was molded from a blend of 80.4% bisphenol A polycarbonate, 10.4% SAN copolymer and 9.2% high rubber graft (all as in Example 1) and various conventional additives including 13.3%, based on total resin content, of a commercially available flame retardant additive. It contained 15.0% total SAN copolymer and 4.6% butadiene units. Upon treatment as described in Example 1 up to and including deposition of the first electroless nickel layer, it passed the cross-hatch tape test with a rating of 5. Some degree of microscopic blistering of the substrate surface was noted; however, it did not affect adhesion. The remaining electroless coating steps were not performed.

What is claimed is:

1. A method for depositing an adherent metal layer on the surface of a resinous substrate comprising a major proportion of aromatic polycarbonate and a minor proportion of at least one addition copolymer comprising structural groups derived from an olefinic nitrile and a conjugated diene, said method comprising the steps of:

contacting at least a portion of said surface with an aqueous alkali metal hydroxide solution having an alkali metal hydroxide concentration of at least about 30% by weight, contacting said surface with concentrated nitric acid alone, and depositing an electroless metal layer on said surface.

2. A method according to claim 1 wherein the electroless metal layer comprises at least one of copper and nickel.

3. A method according to claim 2 wherein the addition copolymer further comprises structural groups derived from an alkenylaromatic compound.

4. A method according to claim 3 wherein the substrate is rinsed with water and dried after contact with the alkali metal hydroxide solution.

5. A method according to claim 4 wherein the first layer of electroless metal deposited is a nickel layer at least about 1.5 microns thick.

6. A method according to claim 4 wherein the polycarbonate is a bisphenol A polycarbonate.

7. A method according to claim 4 wherein the addition polymer is an ABS resin.

8. A method according to claim 7 wherein the proportions of combined styrene and acrylonitrile in the ABS resin are about 60–90% by weight.

9. A method according to claim 8 wherein the styrene comprises about 60–90% by weight of the mixture of styrene and acrylonitrile.

10. A method according to claim 4 wherein the polycarbonate comprises about 65–95% by weight of the polycarbonate-ABS blend.

11. A method according to claim 10 wherein the alkali metal hydroxide concentration is about 40–50% by weight.

12. A method according to claim 11 wherein the alkali metal hydroxide is potassium hydroxide.

13. A method according to claim 11 wherein the contact temperature of the substrate with the alkali metal hydroxide is in the range of about 70°–80° C.

14. A method according to claim 11 wherein the contact temperature of the substrate with the nitric acid is in the range of about 10°–50° C.

* * * * *